(12) United States Patent
Nelson

(10) Patent No.: US 12,446,299 B2
(45) Date of Patent: Oct. 14, 2025

(54) COMBINED MOS/MIS CAPACITOR ASSEMBLY

(71) Applicant: KYOCERA AVX Components Corporation, Fountain Inn, SC (US)

(72) Inventor: Cory Nelson, Simpsonville, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 455 days.

(21) Appl. No.: 17/969,835

(22) Filed: Oct. 20, 2022

(65) Prior Publication Data
US 2023/0326923 A1    Oct. 12, 2023

Related U.S. Application Data

(60) Provisional application No. 63/274,102, filed on Nov. 1, 2021.

(51) Int. Cl.
*H10D 84/00* (2025.01)
*H10D 1/68* (2025.01)

(52) U.S. Cl.
CPC ........... *H10D 84/217* (2025.01); *H10D 1/692* (2025.01)

(58) Field of Classification Search
CPC ........ H10D 84/217; H10D 1/692; H10D 1/66; H10D 84/212
See application file for complete search history.

(56) References Cited

U.S. PATENT DOCUMENTS

| 5,406,447 | A  | * | 4/1995 | Miyazaki | H10D 1/692 257/535 |
|---|---|---|---|---|---|
| 6,356,135 | B1 |   | 3/2002 | Rastegar | |
| 7,389,675 | B1 | * | 6/2008 | Hunter | H10D 64/691 257/253 |
| 8,609,486 | B1 |   | 12/2013 | Smeys et al. | |
| 2005/0017321 | A1 |   | 1/2005 | Hakkarainen et al. | |
| 2005/0245034 | A1 | * | 11/2005 | Fukuda | H10D 62/405 257/E29.268 |
| 2006/0157766 | A1 | * | 7/2006 | Won | H10D 1/692 257/E21.59 |

(Continued)

FOREIGN PATENT DOCUMENTS

KR    20000077182 A    12/2000

OTHER PUBLICATIONS

PCT International Search Report and Written Opinion for PCT/US2022/047220, dated Feb. 15, 2023, 11 pages.

*Primary Examiner* — Bac H Au
(74) *Attorney, Agent, or Firm* — Dority & Manning, P.A.

(57) ABSTRACT

A combined metal-oxide-semiconductor (MOS) and metal-insulator-semiconductor (MIS) capacitor assembly is provided. The capacitor assembly includes a substrate comprising a semiconductor material; an oxide layer formed on a surface of the substrate; and an insulator layer formed over at least a portion of the oxide layer. The capacitor assembly further includes first and second conductive terminals, and a third terminal connected with the substrate. The oxide layer is connected in series between the substrate and the first conductive layer to form a first capacitor between the first terminal and the third terminal. The insulator layer is connected in series between the substrate and the second conductive layer to form a second capacitor between the second terminal and the third terminal.

16 Claims, 6 Drawing Sheets

(56) References Cited

U.S. PATENT DOCUMENTS

| | | | |
|---|---|---|---|
| 2006/0171098 A1* | 8/2006 | Won | H10D 1/682 |
| | | | 361/306.3 |
| 2008/0233744 A1 | 9/2008 | Kaul et al. | |
| 2009/0213522 A1 | 8/2009 | Kim et al. | |
| 2012/0211865 A1 | 8/2012 | Tian et al. | |
| 2014/0367757 A1 | 12/2014 | Jakushokas et al. | |
| 2016/0351413 A1* | 12/2016 | Schmidt | H10D 62/8303 |
| 2016/0351654 A1 | 12/2016 | Oh et al. | |
| 2020/0027946 A1 | 1/2020 | Liu et al. | |
| 2020/0098746 A1* | 3/2020 | Then | H10D 1/66 |

* cited by examiner

COMBINED MOS/MIS CAPACITOR ASSEMBLY

CROSS REFERENCE TO RELATED APPLICATION

The present application claims filing benefit of U.S. Provisional Patent Application Ser. No. 63/274,102 having a filing date of Nov. 1, 2021, which is incorporated herein by reference in its entirety.

FIELD OF THE INVENTION

The subject matter of the present invention relates generally to a combined metal-oxide-semiconductor (MOS) and metal-insulator-semiconductor (MIS) capacitor.

BACKGROUND

Semiconductor-based capacitors can provide a variety of benefits, such as temperature stability, generally high breakdown voltages, and low leakage currents. Thus, semiconductor-based capacitors may be desirable for use in a wide variety of applications, particularly those applications in which reliability when subjected to substantial mechanical and/or environmental stress is desired or necessary.

However, existing semiconductor-based capacitors are generally surface-mounted and take up valuable surface area when mounted to a substrate such as a printed circuit board. For example, some existing semiconductor-based capacitors are typically "flip-chip" mounted and have two terminals on a single surface of the chip. "Flip-chip" mounted capacitors can take up increased surface area in an electronic component because the terminals are generally coplanar, so both terminals take up space in a length direction and a width direction to couple to a component such as a circuit board. This mounting arrangement may not be desirable because of the increased surface area that the capacitor may take up by requiring connections with the two coplanar terminals to form the capacitor. Furthermore, existing semiconductor-based capacitors may be limited in the capacitance value that can be offered by an individual chip.

Consequently, there is a need for a semiconductor-based capacitor that can offer more variety to enable formation of dynamic capacitor arrays within a limited area.

SUMMARY

Objects and advantages of the invention will be set forth in part in the following description, or may be obvious from the description, or may be learned through practice of the invention.

The present invention is directed to a capacitor assembly. The capacitor assembly includes a substrate comprising a semiconductor material; an oxide layer formed on a surface of the substrate; an insulator layer formed over at least a portion of the oxide layer; a first conductive layer formed over at least a portion of the oxide layer; a second conductive layer formed over at least a portion of the insulator layer; a first terminal connected with the first conductive layer; a second terminal connected with the second conductive layer; and a third terminal connected with the substrate. The oxide layer is connected in series between the substrate and the first conductive layer to form a first capacitor between the first terminal and the third terminal. The insulator layer is connected in series between the substrate and the second conductive layer to form a second capacitor between the second terminal and the third terminal.

In one particular embodiment of the capacitor assembly, the insulator layer can be formed from a dielectric material that is different from the oxide layer.

In another embodiment, the insulator layer can include a nitride layer. Further, the insulator layer can include silicon nitride or silicon oxynitride.

In an additional embodiment, the first terminal and the second terminal each have a length in an X-direction, further wherein a ratio of the length of the first terminal to the length of the second terminal can be about 1:1. Moreover, the first terminal and the second terminal each have a width in a Y-direction perpendicular to the X-direction, further wherein a ratio of the width of the first terminal to the width of the second terminal can be about 1:1.

In a further embodiment, the third terminal can be connected with the substrate at a location that is spaced apart from the surface of the substrate in a Z-direction.

In yet another embodiment, the first terminal can be spaced apart from the second terminal in a X-direction and/or a Y-direction.

In still another embodiment, the insulator layer can cover a first portion of the oxide layer that is distinct from a second portion of the oxide layer that is free of the insulator layer.

In an additional embodiment, the first terminal can include an electrically conductive material that directly contacts the oxide layer.

In a further embodiment, the first terminal can include an electrically conductive material that directly contacts the insulator layer.

In another embodiment, the semiconductor material of the substrate can include silicon.

In an additional embodiment, the oxide layer can include silicon oxide.

In yet another embodiment, the first terminal and the second terminal can have a same shape and size, wherein the first capacitor can have a first capacitance value and can have second capacitor has a second capacitance value, wherein the first capacitance value and the second capacitance value can be unequal.

In a further embodiment, the capacitor assembly can include an additional terminal formed over the oxide layer or the insulator layer. Further, the additional terminal can be spaced apart from both the first terminal and the second terminal.

The present invention is further directed to a method of forming a capacitor assembly. The method includes steps of: forming an oxide layer on a surface of a substrate comprising a semiconductor material; forming an insulator layer over at least a portion of the oxide layer; depositing a first conductive layer over at least a portion of the oxide layer; depositing a second conductive layer over at least a portion of the insulator layer; depositing a first terminal on the first conductive layer; and depositing a second terminal on the second conductive layer.

In one particular embodiment, the step of forming the insulator layer can include forming the insulator layer within a first portion of a surface of the oxide layer that is distinct from a second portion of the oxide layer that includes the first terminal; and the step of depositing the first terminal can include depositing the first terminal within the second portion of the oxide layer. Further, the step of forming the insulator layer can include etching the insulator layer within the first portion of the oxide layer. Moreover, the step of forming the insulator layer can include masking the second portion of the oxide layer and forming the insulator layer over the first portion of the oxide layer.

In another embodiment, the method can further include a step of depositing an additional terminal over at least a portion of the oxide layer or the insulator layer, wherein the additional terminal can be spaced apart from the first terminal and the second terminal.

These and other features, aspects, and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Figure 1:
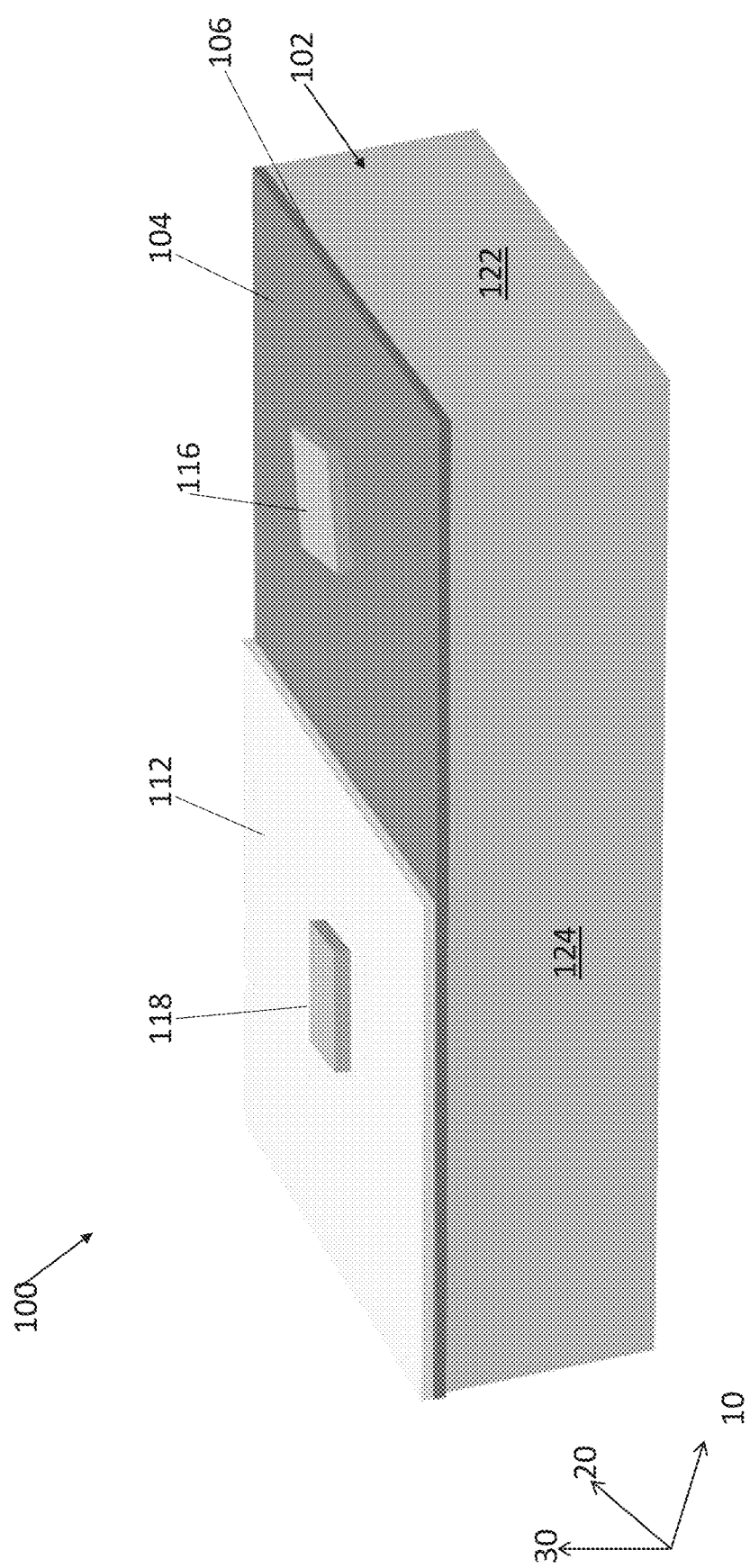
FIG. 1 illustrates a perspective view of a combined MIS/MOS capacitor assembly according to one particular embodiment of the present invention.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the terms "about," "approximately," or "generally," when used to modify a value, indicates that the value can be raised or lowered by 5% and remain within the disclosed embodiment. Further, when a plurality of ranges are provided, any combination of a minimum value and a maximum value described in the plurality of ranges are contemplated by the present invention. For example, if ranges of "from about 20% to about 80%" and "from about 30% to about 70%" are described, a range of "from about 20% to about 70%" or a range of "from about 30% to about 80%" are also contemplated by the present invention.

Generally speaking, the present invention is directed to a capacitor assembly including a combined metal-oxide-semiconductor (MOS) capacitor and metal-insulator-semiconductor (MIS) capacitor. The combined MOS/MIS capacitor assembly can allow a single chip to have different value of capacitors on the same chip while maintaining feasible bond pad sizes.

The combined MOS/MIS capacitor assembly can include a substrate including a semiconductor material, such as silicon, gallium arsenide, germanium, silicon carbide, strontium titanate, and/or mixtures thereof. The substrate can be doped with one or more suitable dopants, such as boron, arsenic, phosphorus, gallium, aluminum, indium, and antimony.

The substrate can have a first end and a second end that is spaced apart from the first end in a longitudinal direction that is perpendicular to a lateral direction, the lateral direction and longitudinal direction each being perpendicular to a vertical Z-direction. The substrate can have a top surface and a bottom surface opposite the top surface in the Z-direction.

The surface of the substrate can generally be smooth. For example, the surface of the substrate can be free of pores, trenches, or the like. The oxide layer can have a generally uniform thickness on the surface of the oxide layer. For example, the thickness of the oxide layer can vary less than 20% across the oxide layer, in some embodiments less than 10%, and in some embodiments less than 5%. As used herein, the term "generally," e.g., "generally smooth" or "generally equal", does not necessarily mean that a characteristic is exactly or perfectly smooth or equal, and may allow a small difference if the respective layers are uniformly connected to adjacent layers within the capacitor assembly and/or when mounted to a substrate such as a circuit board.

As used herein, a first layer that is "formed over" a second layer may refer to the first layer being arranged over the second layer with respect to a thickness direction (i.e., the z-direction) of the monolithic substrate. The first layer may be directly in contact with the second layer. However, intermediate layers may also be formed therebetween such that the first layer and second layer do not directly contact each other.

The combined MOS/MIS capacitor assembly can include an oxide layer formed on a surface of the substrate, e.g., on the top surface of the substrate. The oxide layer can be or include silicon oxide (SiO2) and/or oxides of other example semiconductor materials described herein. The oxide layer can be grown in situ on the substrate. Lithography (e.g., photolithography) techniques can be used to define the shape of the oxide layer, if desired. For instance, portions of the oxide layer can be removed through etching such that the oxide layer is shaped as desired.

The combined MOS/MIS capacitor can include at least an insulator layer formed from a dielectric material formed over at least a portion of the oxide layer. The insulator layer can be or include silicon nitride and/or other electrically insulating materials described herein, including but not limited to silicon oxynitride (SiON). The insulator layer(s) can be formed over a first portion of the oxide layer that is distinct from a second portion of the oxide layer that is free of the insulator layer(s). Lithography (e.g., photolithography) techniques can be used to define the shape of the insulator layer, if desired. For instance, portions of the insulator layer can be removed through etching such that the insulator layer is shaped as desired and to expose at least a portion of the oxide layer below the insulator layer.

By providing an insulator layer formed over the oxide layer, the reliability of a capacitor can be improved. Specifically, any potential defects, e.g., pores, in the oxide layer and/or in the insulator layer are unlikely to be aligned in the Z-direction. For instance, the insulator layer may cover or fill in any defects, holes or imperfections in the surface of the oxide layer. As a result, forming the insulator layer over at least a portion of the oxide layer can reduce the likelihood that the capacitor will short-circuit. Thus, as described above, the capacitance value of the capacitor can be increased by providing the insulator layer formed over the oxide layer. For instance, the capacitance value may be increased by up to one and a half times when the insulator is formed over the oxide layer.

The combined MOS/MIS capacitor can include a first conductive layer formed over at least a portion of the oxide layer. The first conductive layer can be contained within a perimeter of the oxide layer. The first conductive layer can be free of direct contact and/or direct electrical connection with the substrate and free of direct contact and/or direct electrical connection with the insulator layer(s). The conductive layer can be or include metal, such as aluminum, copper, gold, silver, nickel, or mixtures thereof.

The combined MOS/MIS capacitor can include a second conductive layer formed over at least a portion of the insulator layer(s). The second conductive layer can be contained within a perimeter of the insulator layer(s). The second conductive layer can be free of direct contact and/or direct electrical connection with the substrate and free of direct contact and/or direct electrical connection with the oxide layer. The conductive layer can be or include metal, such as aluminum, copper, gold, silver, nickel, or mixtures thereof.

One or more protective layers can be formed over the surface of the substrate. The terminals can be exposed through the protective layers for electrical connection when surface mounting the capacitor. Examples materials for the protective layer include benzocyclobutene (BCB), polyimide, silicon oxynitride, Al2O3, SiO2, Si3N4, epoxy, glass, or another suitable material.

The capacitor assembly of the present invention can be formed as a thin-film capacitor assembly, i.e., having one or more thin-film layers. For instance, the conductive layer, the oxide layer, and the insulator layer can each be formed as a thin-film layer, respectively. The thin-film components may be formed of a variety of suitable materials. The thin-film capacitor may include one or more conductive layers. The conductive layer(s) may include a variety of suitable conductive materials. Example conductive materials include copper, nickel, gold, tin, lead, palladium, silver, and alloys thereof. Any conductive metallic or non-metallic material that is suitable for thin-film fabrication may be used, however.

Various thin-film techniques can be used to form thin-film layers, such as the conductive layer, insulator layer(s), terminals, or the like. Examples of such techniques that may be employed include chemical deposition (e.g., chemical vapor deposition), physical deposition (e.g., sputtering), or any other suitable deposition technique for forming thin-film elements. Additional examples include any suitable patterning technique (e.g., photolithography), etching, and any other suitable subtractive technique for forming thin-film elements.

The thin-film layers can have a range of thicknesses. For example, the thin-film layers can have thicknesses that can range from about 0.0375 micrometers (microns) to about 40 microns, in some embodiments from about 0.1 microns to about 30 microns, in some embodiments from about 0.2 microns to about 20 microns in some embodiments from about 0.4 microns to about 10 microns.

The thin-film components may be precisely formed using a variety of suitable subtractive, semi-additive, or fully additive processes. For example, physical vapor deposition and/or chemical deposition may be used. For instance, in some embodiments, the thin-film components may be formed using sputtering, a type of physical vapor deposition. A variety of other suitable processes may be used, however, including plasma-enhanced chemical vapor deposition (PECVD), electroless plating, and electroplating, for example. Lithography masks and etching may be used to produce the desired shape of the thin-film components. A variety of suitable etching techniques may be used including dry etching using a plasma of a reactive or non-reactive gas (e.g., argon, nitrogen, oxygen, chlorine, boron trichloride) and/or wet etching.

The combined MOS/MIS capacitor can include a first terminal connected with the first conductive layer. A second terminal can be connected with the second conductive layer. As used herein "connected with" can refer to components that are in directly physically contact. "Connected with" can also refer to items that are physically connected by one or intermediate conductive layers such that the items are in direct electrically connection (e.g., without a resistive layer or dielectric layer therebetween). The first terminal can be formed over the first conductive layer. The second terminal can be formed over the second conductive layer. For instance, the first and second terminals can be coupled to the respective first and second conductive layers, e.g., directly contacting with the respective first and second conductive layers. The first and second terminals can be contained within a perimeter of the respective first and second conductive layers.

Each of the first terminal and the second terminal can be exposed along a surface of the substrate. Each of the first terminal and the second terminal can be configured to provide a wire bond terminal.

The combined MIS/MOS capacitor assembly can have a third terminal connected with a surface of the substrate, e.g., a surface of the substrate opposite the surface of the substrate upon which the oxide layer is formed in the Z-direction. The third terminal can connect to a ground or act as a ground on the backside of the substrate. Both the first terminal and the second terminal can be spaced apart from the third terminal of the substrate in a Z-direction. The third terminal can be formed by a bare surface of the substrate. Additionally or alternatively, the third terminal can include a third conductive layer formed over a surface of the substrate opposite the surface of the substrate upon which the oxide layer is formed in the Z-direction.

The capacitor assembly can be connected and arranged such that the insulator layer covers less than all of the surface of the oxide layer. For example, the insulator layer and the first terminal can be spaced apart from the second terminal in a X-direction. An edge of the insulator layer can be aligned with a Y-direction that is perpendicular to the X-direction. Optionally, an edge of the oxide layer can be spaced apart from an end of the substrate in the X-direction and/or the Y-direction, and an edge of the insulator layer can be spaced apart from an end of the substrate in the X-direction and/or the Y-direction.

The first terminal can be connected with the oxide layer at a location that is spaced apart from the insulator layer along the surface of the substrate. For example, the first terminal can be located between the edge of the insulator layer and the end of the substrate. The edge of the insulator layer can be spaced apart from the first terminal by a distance that is greater than about 2 microns, in some embodiments greater than about 5 microns, in some embodiments greater than about 10 microns, and in some embodiments greater than about 15 microns.

The insulator layer can cover a first portion of the oxide layer that is distinct from a second portion of the oxide layer that is free of the insulator layer. The first terminal can be connected with the oxide layer within the second portion of the oxide layer. The first terminal can include an electrically conductive material that directly contacts the oxide layer.

The substrate can have a pair of end surfaces that are perpendicular to the surface of the monolithic substrate. The pair of end surfaces can be free of terminations, including the terminals. As a further example, the first terminal, the second terminal, or both can be spaced apart from the pair of opposite end edges of the surface of the monolithic substrate by respective distances. The distances can be 10 microns or greater, in some embodiments 15 microns or greater, in some embodiments 20 microns or greater, in some embodiments 40 microns or greater, and in some embodiments 50 microns or greater.

A first capacitor C1 can be formed between the first terminal and the third terminal. A second capacitor C2 can be formed between the second terminal and the third terminal. Due to the presence of the insulator layer(s) beneath the second terminal, the first capacitor C1 and the second capacitor C2 can have different capacitance values. Meanwhile, depending on the area of the capacitor chip, as described above, as well as additional factors including the dielectric constant and properties of the materials used to form each capacitor, each capacitor can maintain a capacitance value in a range between about 0.1 pF and about 1800 pF, such as from about 1 pF to about 1500 pF, for instance from about 10 pF to about 1000 pF.

Although the embodiment of the capacitor assembly described above includes only a first terminal formed over the oxide layer and a second terminal formed over the insulator layer, it is to be understood that the present invention contemplates any number n of terminals to form any number n of capacitors, where n is greater than or equal to 2. For instance, two or more terminals can be formed over the oxide layer, and two or more terminals can be formed over the insulator layer, in order to achieve a desired capacitance amount for the capacitor assembly.

A method of forming a capacitor assembly can include steps of: forming an oxide layer on a surface of a substrate comprising a semiconductor material; forming an insulator layer over at least a portion of the oxide layer; depositing a first conductive layer over at least a portion of the oxide layer; depositing a second conductive layer over at least a portion of the insulator layer; depositing a first terminal on the first conductive layer; and depositing a second terminal on the second conductive layer.

The specific features of the capacitor assembly of the present invention may be better understood with reference to FIGS. 1-6.

FIG. 1 is a perspective view of a capacitor assembly 100 according to aspects the present disclosure. The capacitor assembly 100 can include a substrate 102 including a semiconductor material, such as silicon. The capacitor assembly 100 can include an oxide layer 104 formed on a surface 106 of the substrate 102. The capacitor assembly 100 can include a first conductive layer 108 formed over at least a portion of the oxide layer 104. The first conductive layer 108 can be contained within a perimeter 110 of the oxide layer 104. The first conductive layer 108 can be free of direct contact and/or direct electrical connection with the substrate 102.

The capacitor assembly can further include an insulator layer 112, such as silicon nitride or silicon oxynitride, formed over at least a portion of the oxide layer 104. The capacitor assembly 100 can include a second conductive layer 114 formed over at least a portion of the insulator layer 112. The second conductive layer 114 can be contained within a perimeter 116 of the insulator layer 112. The second conductive layer 114 can be free of direct contact and/or direct electrical connection with the substrate 102 and free of direct contact and/or direct electrical connection with the oxide layer 104.

A first terminal 116 can be connected with the first conductive layer 108. A second terminal 118 can be connected with the second conductive layer 114. Each of the first terminal 116 and the second terminal 118 can be exposed along the surface 106 of the substrate 102. The first terminal 116 can be co-planar with the insulator layer 112. For example, each of the first terminal 116 and the insulator layer 112 can be formed exclusively on the oxide layer 104.

The first terminal 116 can be spaced apart from the second terminal 118 in a X-direction 10 and/or a Y direction 20. An edge 156 of the insulator layer 112 can be aligned with a Y-direction 20 that is perpendicular to the X-direction 10. Additionally, an edge 160 of the insulator layer 112 can be aligned with the X direction 10 that is perpendicular to the Y direction 20.

The first terminal 116 can be connected with the oxide layer 104 at a location that is spaced apart from the insulator layer 112 along the surface 106 of the substrate 102. For example, the first terminal 116 can be located between the edge 156 of the insulator layer 112 and the end 122 of the substrate 102. The edge 156 of the insulator layer 112 can be spaced apart from the first terminal 116 by a distance 158. In some embodiments, the distance 158 can be greater than about 2 microns.

The substrate 102 can be a monolithic substrate that includes a surface 106 as described above. The surface 106 can be a top surface of the substrate 102. The substrate 102 can include a first side 120 and a second side 122 which each extend parallel to the X-direction 10. The substrate 102 can include a first edge 124 and a second edge 126 which each extend parallel to the Y-direction 20. The top surface 106 can extend between the first side 120 and the second side 122 in the X-direction 10 and between the first edge 124 and the second edge 126 in the Y-direction 20. The substrate 102 can further include a bottom surface 128, i.e., backside, that extends parallel to the top surface 106 in a vertical Z-direction. The bottom surface 128 can extend between the first side 120 and the second side 122 in the X-direction 10 and between the first edge 124 and the second edge 126 in the Y-direction 20.

The capacitor assembly 100 can include a third terminal 130 on the bottom surface 130 of the substrate 102. The third terminal 130 can be formed by the bare material of the bottom surface 130 of the semiconductor substrate 102. Additionally or alternatively, the third terminal 130 can be formed from a layer 132 of conductive material formed over the bottom surface 128 of the substrate 102 opposite the top surface 106 in the Z-direction. The third terminal 130 can connect to a ground or act as a ground on the backside of the substrate.

The oxide layer 104 can be formed exclusively on the top surface 106 of the substrate 102. For instance, the oxide layer 104 can be formed within a portion 134 of the surface 106. The portion 134 can extend over the entire top surface 106, i.e., from the first side 120 to the second side 122 from the first edge 124 to the second edge 126, or any portion thereof. The oxide layer 104 can have a length 140 in the X direction 10 and a width 142 in the Y direction 20.

The insulator layer 112 can be formed over a first portion 136 of the oxide layer 104. The first portion 136 can be distinct from a second portion 138 of the oxide layer 104 that is free of the insulator layer 112. The insulator layer 112 can have a length 144 in the X direction 10 and a width 146 in the Y direction 20. The length 144 and/or the width 146 of the insulator layer 112 can be less than the respective length 140 and/or width 142 of the oxide layer 104. Stated differently, only one of the length 144 or the width 146 of the insulator layer 112 can be equal to the respective length 140 or width 142 of the oxide layer 104. In the illustration of the capacitor assembly 100 shown in FIG. 1 and FIG. 2, the length 144 of the insulator layer 112 in the X direction 10 is less than the length 140 of the oxide layer 104, and the width 146 of the insulator layer 112 is less than or generally equal to the width 142 of the oxide layer 104. However, it is to be understood that, in other aspects of the present invention, the length 144 and the length 104 can be generally equal when the width 146 of the insulator layer 112 in the Y direction is less than the width 142 of the oxide layer 104 in the Y direction. In further aspects of the present invention, both the length 140 and the width 142 of the insulator layer 112 can be less than the length 144 and the width 146 of the oxide layer 104. The dimensions of the length 140 and the width 142 of the insulator layer 112 relative to the oxide layer 104 can be sufficient to allow the second portion 138 of the oxide layer 104 to include the first terminal 116 thereon.

Figure 2:
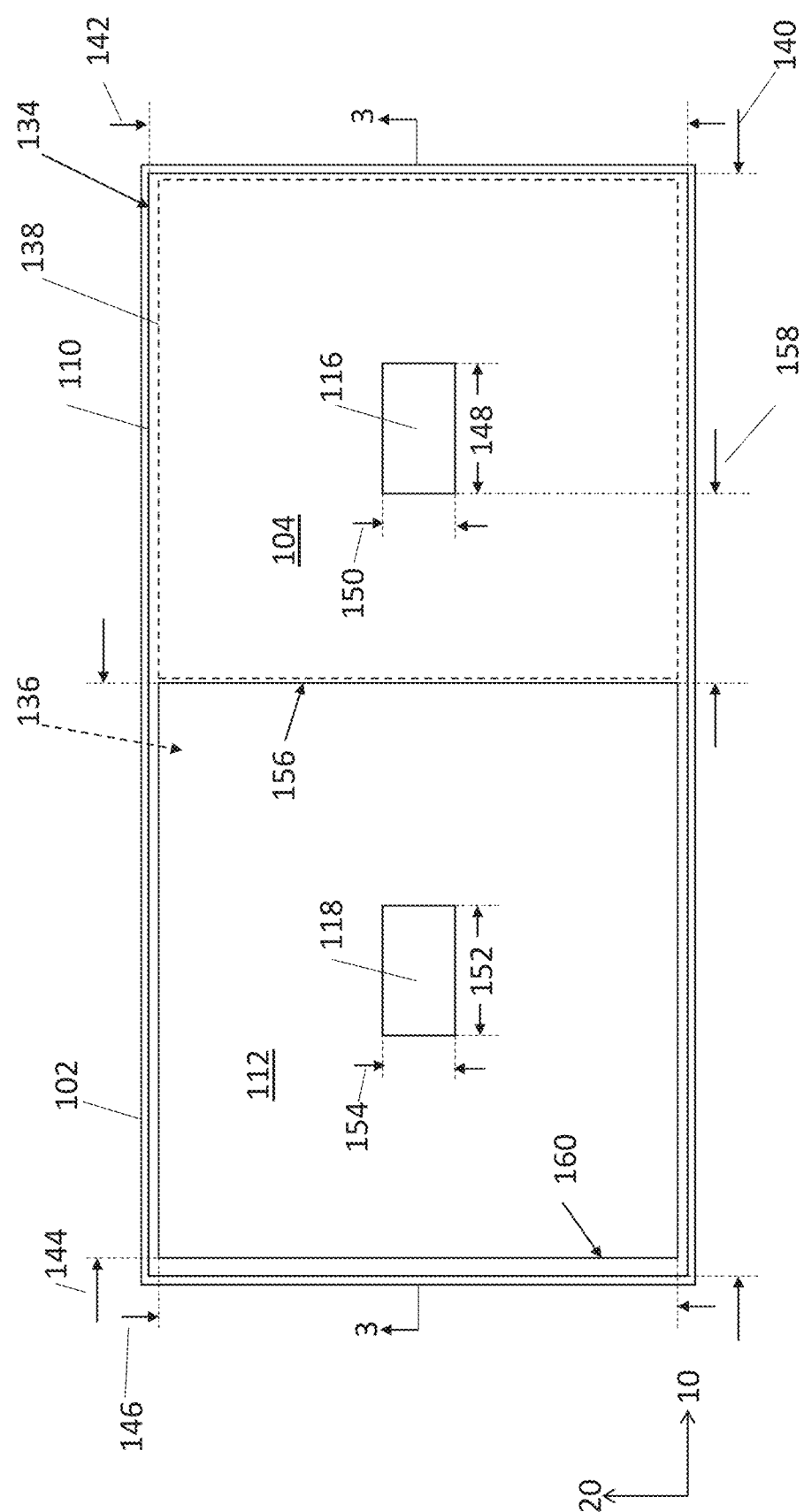
FIG. 2 illustrates a top view of the capacitor assembly of FIG. 1.

As shown in FIGS. 1 and 2, the first conductive layer 108 and the first terminal 116 can be formed within the second portion 138 of the oxide layer 104. The first terminal 116 and the second terminal 118 can be spaced from each other in the X direction 10 and/or the Y direction 20. The first terminal 116 can have a length 148 in the X direction and a width 150 in the Y direction. The second conductive layer 114 and the second terminal 118 can be formed over the insulator layer 112. The second terminal 118 can have a length 152 in the X direction and a width 154 in the Y direction.

In some aspects of the present invention, the first terminal 116 and the second terminal 118 can have the same shape and size. In other words, the length 148 can be substantially equal to the length 152, and the width 150 can be substantially equal to the width 154. Stated differently, a ratio of the length 148 to the length 152 can be about 1:1, and a ratio of the width 150 to the width 154 can be about 1:1. In such an arrangement, the capacitor assembly 100 can include a first capacitor formed between the first terminal 116 and the third terminal 130 and a second capacitor formed between the second terminal 118 and the third terminal 130, where the first capacitor and the second capacitor have different capacitance values. The first capacitor and the second capacitor have different capacitance values due to the presence of the insulator layer 112 in the second capacitor.

Moreover, the first terminal 116 and the second terminal 118 can optionally have different dimensions. In other words, the length 148 can be different from the length 152, and/or the width 150 can be different from the width 154. Such arrangements can be contemplated to enable the first capacitor formed between the first terminal 116 and the third terminal 130 and the second capacitor formed between the second terminal 118 and the third terminal 130 to be more precisely selected based on the desired capacitance value of the capacitor assembly 100.

Figure 3:
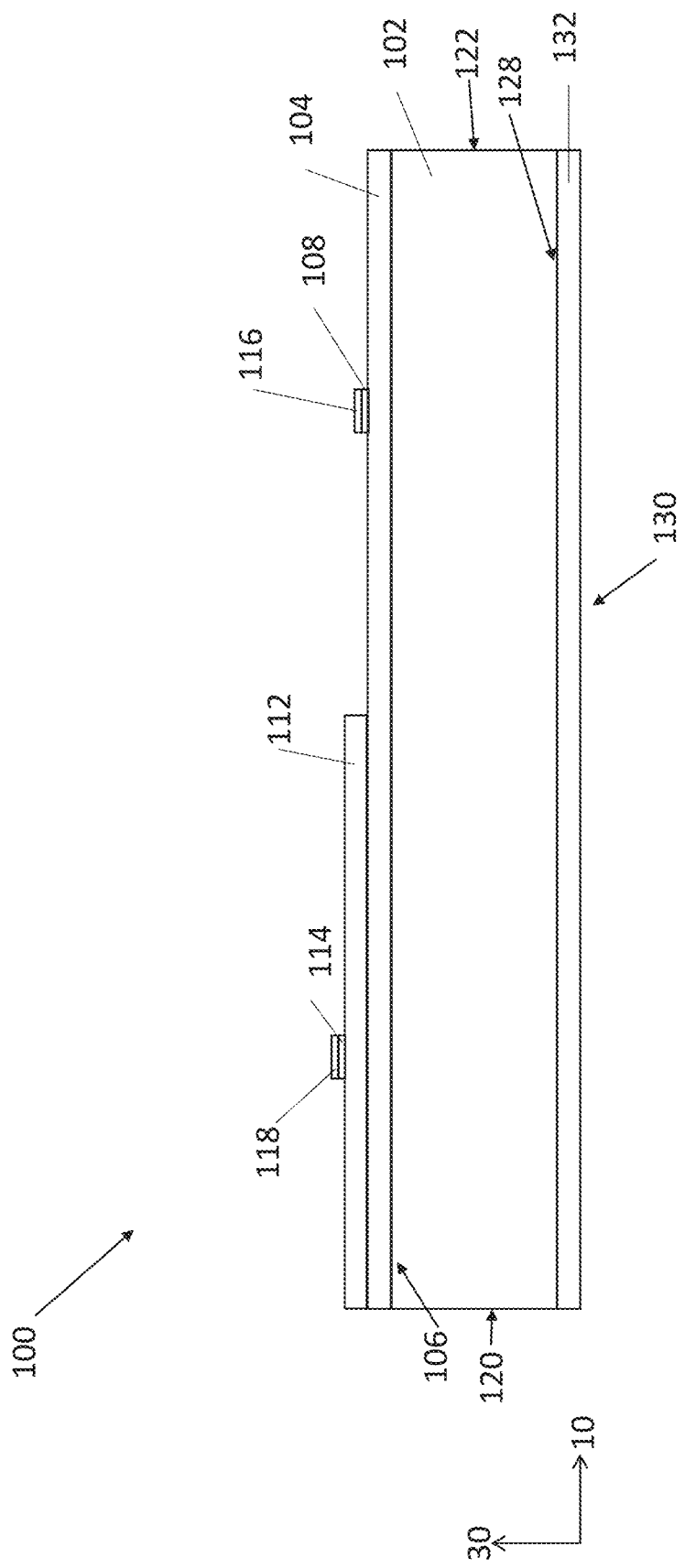
FIG. 3 illustrates a cross-sectional view of the capacitor assembly of FIG. 1 taken along the line 3-3 shown in FIG. 2.
Figure 4:
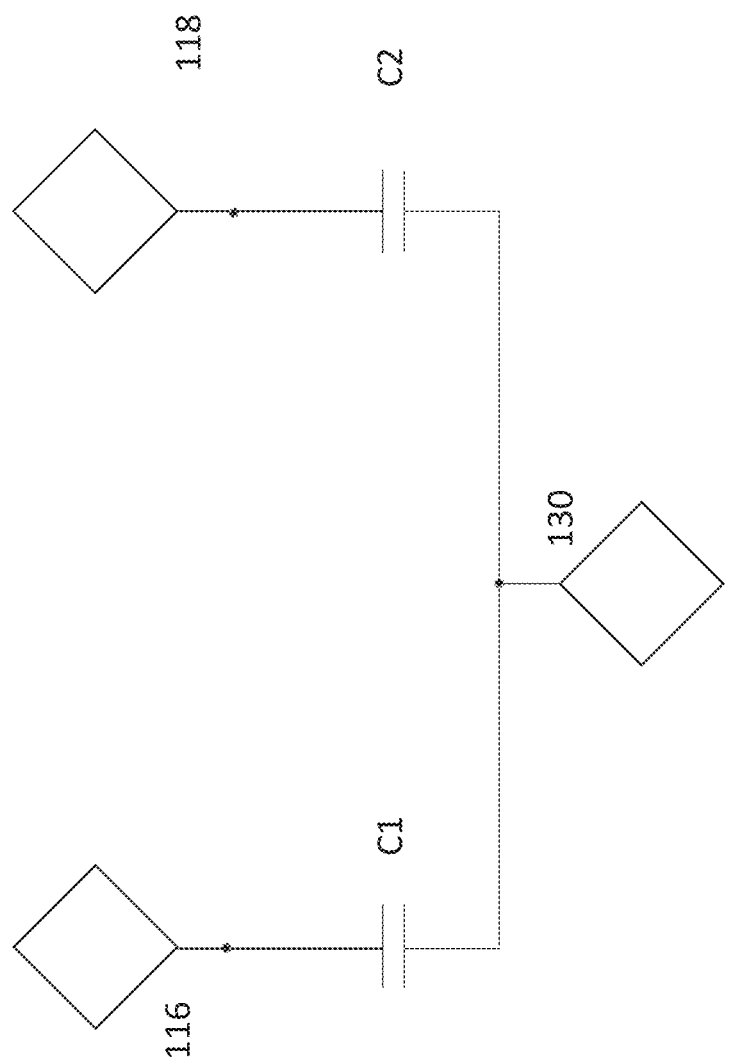
FIG. 4 illustrates a circuit diagram of the capacitor assembly of FIG. 1.

FIG. 4 illustrates a circuit diagram of the capacitor assembly 100 of FIGS. 1-3. The circuit diagram illustrates a first capacitor C1 coupled to the first terminal 116 and a second capacitor C2 coupled to the second terminal 118. Both the first capacitor C1 and the second capacitor C2 are coupled to the third terminal 130, i.e., the same ground port.

Figure 5:
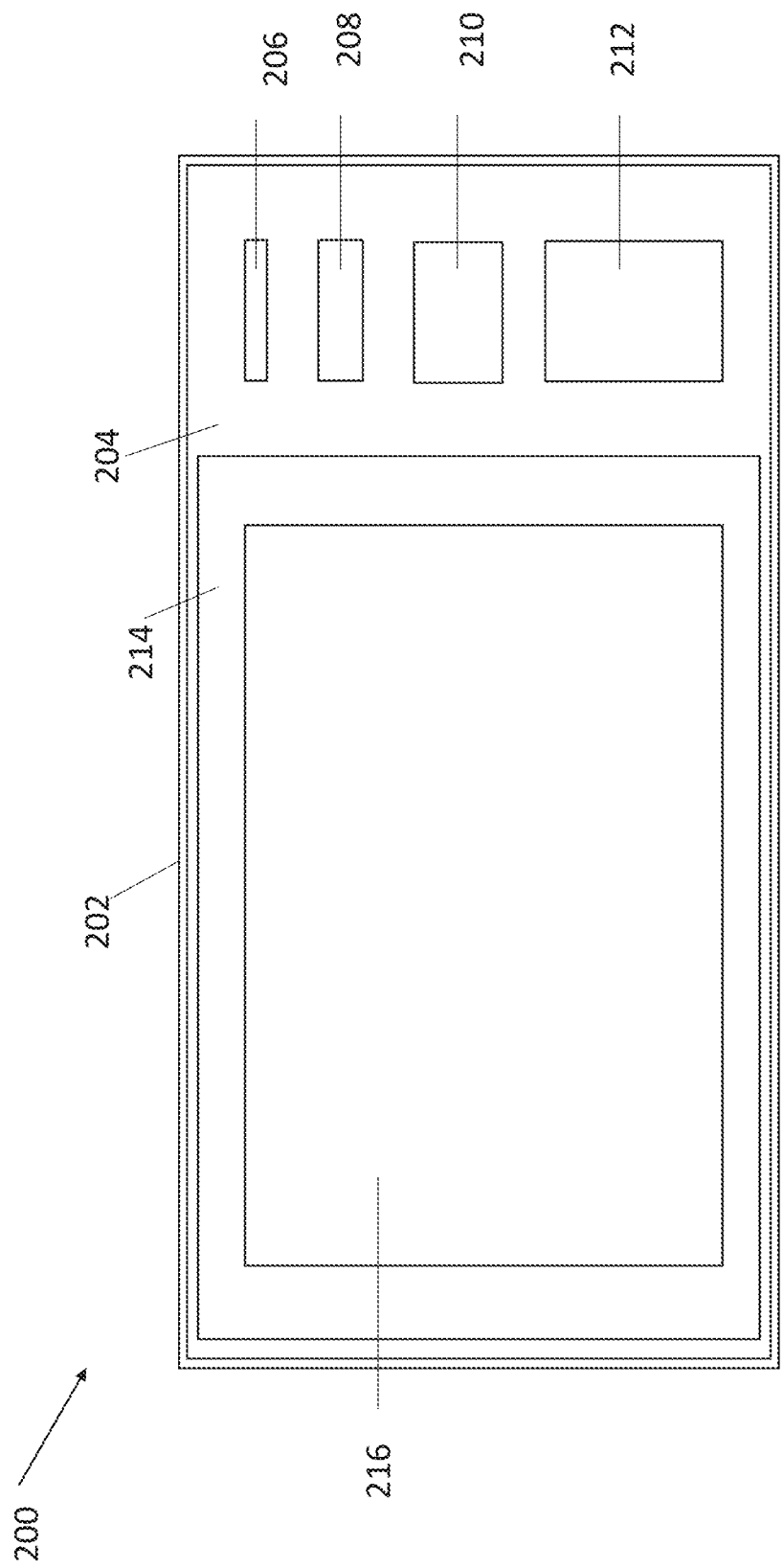
FIG. 5 illustrates a top view of a capacitor assembly according to another embodiment of the present invention.

FIG. 5 illustrates a capacitor assembly 200 of another embodiment of the present invention. The capacitor assembly 200 can include a substrate 202 including a semiconductor material, such as silicon. The capacitor assembly 200 can include an oxide layer 204 formed on a surface of the substrate 202. The capacitor assembly 200 can include a conductive layer (not shown) formed over at least a portion of the oxide layer 204. The conductive layer can be contained within a perimeter of the oxide layer 204. The conductive layer can be free of direct contact and/or direct electrical connection with the substrate 202. One or more terminals can be connected with the conductive layer. For instance, as shown, a first terminal 206, a second terminal 208, a third terminal 210, and a fourth terminal 212 can be formed over the oxide layer 204 connected to the conductive layer (not shown). As illustrated in FIG. 5, the terminals 206, 208, 210, 212 can have varying dimensions in the X direction 10 and/or the Y direction 20.

The capacitor assembly 200 can further include an insulator layer 214, such as silicon nitride or silicon oxynitride, formed over at least a portion of the oxide layer 204. The capacitor assembly 200 can include a conductive layer (not shown) formed over at least a portion of the insulator layer 214 and contained within a perimeter of the insulator layer 214. The conductive layer formed over the insulator layer 214 can be free of direct contact and/or direct electrical connection with the substrate 202 and free of direct contact and/or direct electrical connection with the oxide layer 204. One or more terminals can be connected with the conductive layer formed over the insulator layer 214. For instance, a fifth terminal 216 can be connected with the conductive layer formed over the insulator layer 214.

Each of the terminals 206, 208, 210, 212 and 216 can be exposed along the surface of the substrate 102. The terminals 206, 208, 210, 212 can be co-planar with the insulator layer 214. For example, each of the terminals 206, 208, 210, 212 and the insulator layer 214 can be formed exclusively on the oxide layer 204.

The first terminal 116 can be spaced apart from the second terminal 118 in a X-direction 10 and/or a Y direction 20. An edge 156 of the insulator layer 112 can be aligned with a Y-direction 20 that is perpendicular to the X-direction 10. Additionally, an edge 160 of the insulator layer 112 can be aligned with the X direction 10 that is perpendicular to the Y direction 20.

Figure 6:
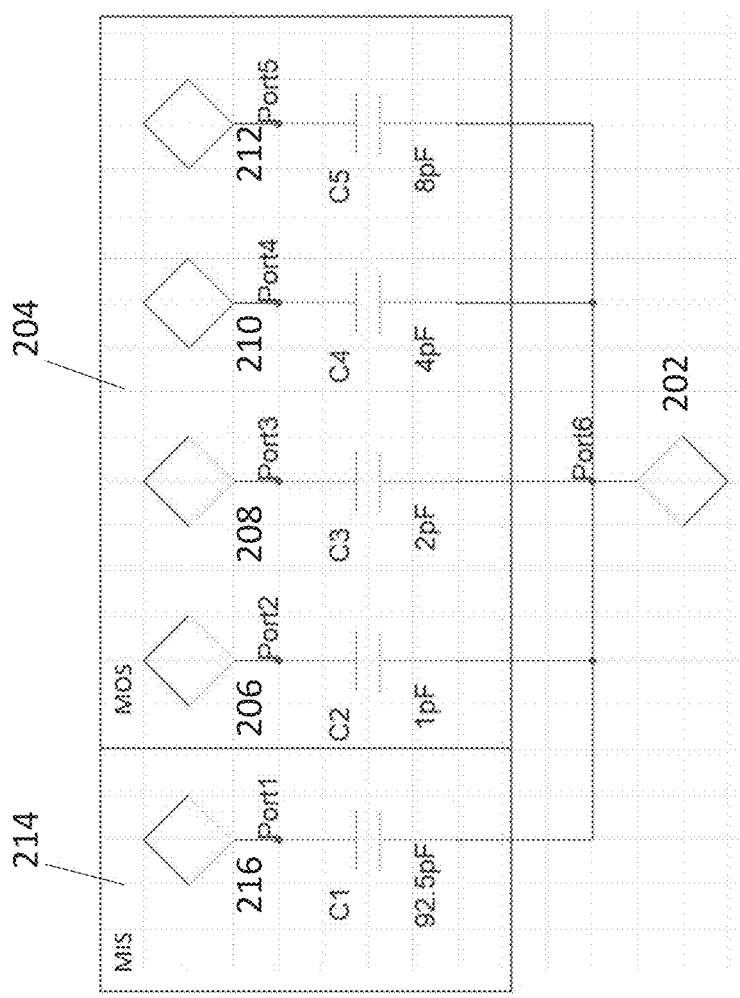
FIG. 6. Illustrates a circuit diagram of the capacitor assembly of FIG. 5.

FIG. 6 illustrates a circuit diagram of the capacitor assembly 200 of FIG. 5. As shown in FIG. 6, a first capacitor C1 is coupled to the fifth terminal 216 formed over the insulator layer 214. A second capacitor C2 is coupled to the first terminal 206, a third capacitor C3 is coupled to the second terminal 208, a fourth capacitor C4 is coupled to the third terminal 210, and a fourth capacitor C4 is coupled to the fourth terminal 212. Each of the capacitors C1, C2, C3, C4, and C5 are coupled to a common ground terminal, e.g., formed by the substrate 202. As shown in FIG. 6, each of the capacitors C1, C2, C3, C4, and C5 can have a different capacitance value, e.g., determined by the area and dielectric materials of the capacitors, respectively. As illustrated in FIG. 5, the varied dimensions, and therefore areas, of the terminals 206, 208, 210 and 212 can yield different capacitance values of each respective capacitor. The capacitance values shown in FIG. 6 are only one example of varying capacitance values contemplated by a capacitor assembly of the present invention and demonstrate a non-limiting embodiment of the present invention.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they include structural elements that do not differ from the literal language of the claims or if they include equivalent structural elements with insubstantial differences from the literal language of the claims.

What is claimed is:

1. A capacitor assembly comprising:
    a substrate comprising a semiconductor material;
    an oxide layer formed on a surface of the substrate;
    an insulator layer formed over at least a portion of the oxide layer;
    a first conductive layer formed over at least a portion of the oxide layer;
    a second conductive layer formed over at least a portion of the insulator layer;
    a first terminal connected with the first conductive layer;
    a second terminal connected with the second conductive layer; and
    a third terminal connected with the substrate;
    wherein the oxide layer is connected in series between the substrate and the first conductive layer to form a first capacitor between the first terminal and the third terminal; and
    wherein the insulator layer is connected in series between the substrate and the second conductive layer to form a second capacitor between the second terminal and the third terminal.

2. The capacitor assembly of claim 1, wherein the insulator layer is formed from a dielectric material that is different from the oxide layer.

3. The capacitor assembly of claim 1, wherein the insulator layer comprises a nitride layer.

4. The capacitor assembly of claim 3, wherein the insulator layer comprises silicon nitride or silicon oxynitride.

5. The capacitor assembly of claim 1, wherein the first terminal and the second terminal each have a length in an X-direction, further wherein a ratio of the length of the first terminal to the length of the second terminal is about 1:1.

6. The capacitor assembly of claim 5, wherein the first terminal and the second terminal each have a width in a Y-direction perpendicular to the X-direction, further wherein a ratio of the width of the first terminal to the width of the second terminal is about 1:1.

7. The capacitor assembly of claim 1, wherein the third terminal is connected with the substrate at a location that is spaced apart from the surface of the substrate in a Z-direction.

8. The capacitor assembly of claim 1, wherein:
    the first terminal is spaced apart from the second terminal in a X-direction and/or a Y-direction.

9. The capacitor assembly of claim 1, wherein:
    the insulator layer covers a first portion of the oxide layer that is distinct from a second portion of the oxide layer that is free of the insulator layer.

10. The capacitor assembly of claim 1, wherein the first terminal comprises an electrically conductive material that directly contacts the oxide layer.

11. The capacitor assembly of claim 1, wherein the first terminal comprises an electrically conductive material that directly contacts the insulator layer.

12. The capacitor assembly of claim 1, wherein the semiconductor material of the substrate comprises silicon.

13. The capacitor assembly of claim 1, wherein the oxide layer comprises silicon oxide.

14. The capacitor assembly of claim 1, wherein first terminal and the second terminal have a same shape and size,
    wherein the first capacitor has a first capacitance value and the second capacitor has a second capacitance value,
    wherein the first capacitance value and the second capacitance value are unequal.

15. The capacitor assembly of claim 1, further comprising an additional terminal formed over the oxide layer or the insulator layer.

16. The capacitor assembly of claim 15, wherein the additional terminal is spaced apart from both the first terminal and the second terminal.

* * * * *